United States Patent
Dono et al.

(10) Patent No.: US 9,130,556 B2
(45) Date of Patent: Sep. 8, 2015

(54) SEMICONDUCTOR DEVICE HAVING OUTPUT BUFFER CIRCUIT IN WHICH IMPEDANCE THEREOF CAN BE CONTROLLED

(75) Inventors: Chiaki Dono, Tokyo (JP); Takenori Sato, Tokyo (JP); Shinya Miyazaki, Tokyo (JP)

(73) Assignee: PS4 Luxco S.a.r.l., Luxembourg (LU)

( * ) Notice: Subject to any disclaimer, the term of this patent is extended or adjusted under 35 U.S.C. 154(b) by 151 days.

(21) Appl. No.: 13/618,639

(22) Filed: Sep. 14, 2012

(65) Prior Publication Data

US 2013/0082758 A1    Apr. 4, 2013

(30) Foreign Application Priority Data

Sep. 29, 2011 (JP) .................. 2011-213699

(51) Int. Cl.
  H03L 5/00      (2006.01)
  H03K 19/00     (2006.01)
  H03K 19/0185   (2006.01)

(52) U.S. Cl.
  CPC .... H03K 19/0005 (2013.01); H03K 19/018521 (2013.01); H03K 19/018528 (2013.01)

(58) Field of Classification Search
  CPC .............. H03K 19/018521; H03K 19/018528; G11C 7/1051; G11C 8/08
  See application file for complete search history.

(56) References Cited

U.S. PATENT DOCUMENTS

| | | | |
|---|---|---|---|
| 7,215,128 B2 | 5/2007 | Fujisawa | |
| 7,495,453 B2 | 2/2009 | Fujisawa | |
| 7,764,107 B2 * | 7/2010 | Karim | 327/407 |
| 7,808,270 B2 | 10/2010 | Fujisawa | |
| 7,884,646 B1 * | 2/2011 | Bourstein | 326/81 |
| 8,198,911 B2 | 6/2012 | Fujisawa | |
| 2004/0095181 A1 * | 5/2004 | Ohtsuka et al. | 327/408 |
| 2006/0158198 A1 | 7/2006 | Fujisawa | |
| 2007/0194798 A1 | 8/2007 | Fujisawa | |
| 2009/0146756 A1 | 6/2009 | Fujisawa | |
| 2011/0001511 A1 | 1/2011 | Fujisawa | |
| 2012/0139608 A1 * | 6/2012 | Kao | 327/335 |
| 2012/0217992 A1 | 8/2012 | Fujisawa | |

FOREIGN PATENT DOCUMENTS

JP    2006-203405 A    8/2006

* cited by examiner

Primary Examiner — Sibin Chen

(57) ABSTRACT

Disclosed herein is a device that includes a first buffer circuit coupled between a first power supply line and a data terminal and a second buffer circuit coupled between a second power supply line and the data terminal. First and second internal data signals complementary to each other are supplied to a level shifter, thereby third and fourth internal data signals complementary to each other are generated by changing amplitude values of the first and second internal data signals. The first and the second buffer circuits are controlled based on the third and fourth internal data signals such that one of the first and second buffer circuits turns on and the other of the first and second buffer circuits turns off.

19 Claims, 13 Drawing Sheets

| IODT | DRV | OUTPUT |
|------|-----|--------|
| "L"  | "L" | ODTC   |
|      | "H" | RONC   |
| "H"  | "L" | All "L" |
|      | "H" | RONC   |

SEMICONDUCTOR DEVICE HAVING OUTPUT BUFFER CIRCUIT IN WHICH IMPEDANCE THEREOF CAN BE CONTROLLED

BACKGROUND OF THE INVENTION

1. Field of the Invention

The present invention relates to semiconductor devices and, in particular, relates to a semiconductor device including a level shifter.

2. Description of Related Art

In semiconductor devices such as DRAM (Dynamic Random Access Memory), an output buffer circuit is provided for outputting a data signal to the outside of the semiconductor device. Some of versatile semiconductor devices, in particular, are configured to be able to select impedance of the output buffer circuit (See Japanese Patent Application Laid-open No. 2006-203405).

As disclosed in Japanese Patent Application Laid-open No. 2006-203405, the output buffer circuit has the structure in which a pull-up buffer circuit consisting of p-channel MOS transistors and a pull-down buffer circuit consisting of n-channel MOS transistors are connected in series. A data terminal is connected to a contact node between the pull-up buffer circuit and the pull-down buffer circuit. When a high-level data signal is outputted from the data terminal, it is controlled in such a manner that the pull-up buffer circuit is turned on and the pull-down buffer circuit is turned off. On the other hand, when a low-level data signal is outputted from the data terminal, it is controlled in such a manner that the pull-up buffer circuit is turned off and the pull-down buffer circuit is turned on.

During a period when the data signal is not outputted from the data terminal, however, it is necessary to allow the output buffer circuit to be in a high impedance state or to function as a termination resistor having predetermined impedance. The function of the output buffer circuit as the termination resistor is referred to as ODT (On Die Termination).

In order to allow the output buffer circuit to be in the high impedance state, it is necessary to turn off both of the pull-up buffer circuit and the pull-down buffer circuit. With DDR3 (Double Data Rate 3) SDRAM (Synchronous DRAM), both of the pull-up buffer circuit and the pull-down buffer circuit need to be turned on when the output buffer circuit performs ODT operation. Thus, it is necessary for the DDR3 SDRAM to deal with four cases in total, that is, the case where only the pull-up buffer circuit is turned on, the case where only the pull-down buffer circuit is turned on, the case where both of the buffer circuits are turned on, and the case where both of the buffer circuit are turned off. Therefore, operation of the pull-up buffer circuit and operation of the pull-down buffer circuit need to be controllable separately.

Generally, the DRAM generates an internal voltage that is lower than an external voltage, and drives various peripheral circuits by the internal voltage so as to reduce power consumption. In this case, a difference arises between an amplitude value of an internal signal voltage, and an amplitude value of an external signal voltage, and a level of the amplitude value is converted by a level shifter disposed in a data path. To realize the above-described four cases in the pull-up buffer circuit and the pull-down buffer circuit, at least two-bit signals and at least two level shifters are required. When high-speed operation of the DRAM is performed, it is also necessary to provide an adjustment circuit because skew in rising and falling edges becomes unable to ignore.

SUMMARY

In one embodiment, there is provided a semiconductor memory device that includes: a data terminal; a first power supply line supplying a first potential; a second power supply line supplying a second potential different from the first potential; a first buffer circuit coupled between the first power supply line and the data terminal; a second buffer circuit coupled between the second power supply line and the data terminal; a first control circuit generating first and second internal data signals that are complementary to each other; and a level shifter generating third and fourth internal data signals that are complementary to each other by changing amplitude values of the first and second internal data signals. The first and the second buffer circuits are controlled based on the third and fourth internal data signals such that one of the first and second buffer circuits turns on and the other of the first and second buffer circuits turns off.

In another embodiment, there is provided a semiconductor device that includes: a data terminal; a first power supply line supplying a first potential; a second power supply line supplying a second potential different from the first potential; a plurality of first unit buffer circuits coupled in parallel between the first power supply line and the data terminal; a plurality of second unit buffer circuits coupled in parallel between the second power supply line and the data terminal; a level shifter changing an amplitude of one-bit signal from a first amplitude to a second amplitude between first and second potentials; a first circuit controlling the first unit buffer circuits such that all the first unit buffer circuits are turned off when the one-bit signal from the level shifter has a first value, and that selected zero or more of the first unit buffer circuits are turned on based on a value of a selection signal when the one-bit signal from the level shifter has a second value; and a second circuit controlling the second unit buffer circuits such that all the second unit buffer circuits are turned off when the one-bit signal from the level shifter has a second value, and that selected zero or more of the second unit buffer circuits are turned on based on a value of the selection signal when the one-bit signal from the level shifter has a first value.

DETAILED DESCRIPTION OF THE EMBODIMENTS

Preferred embodiments of the present invention will be explained below in detail with reference to the accompanying drawings.

Figure 1:
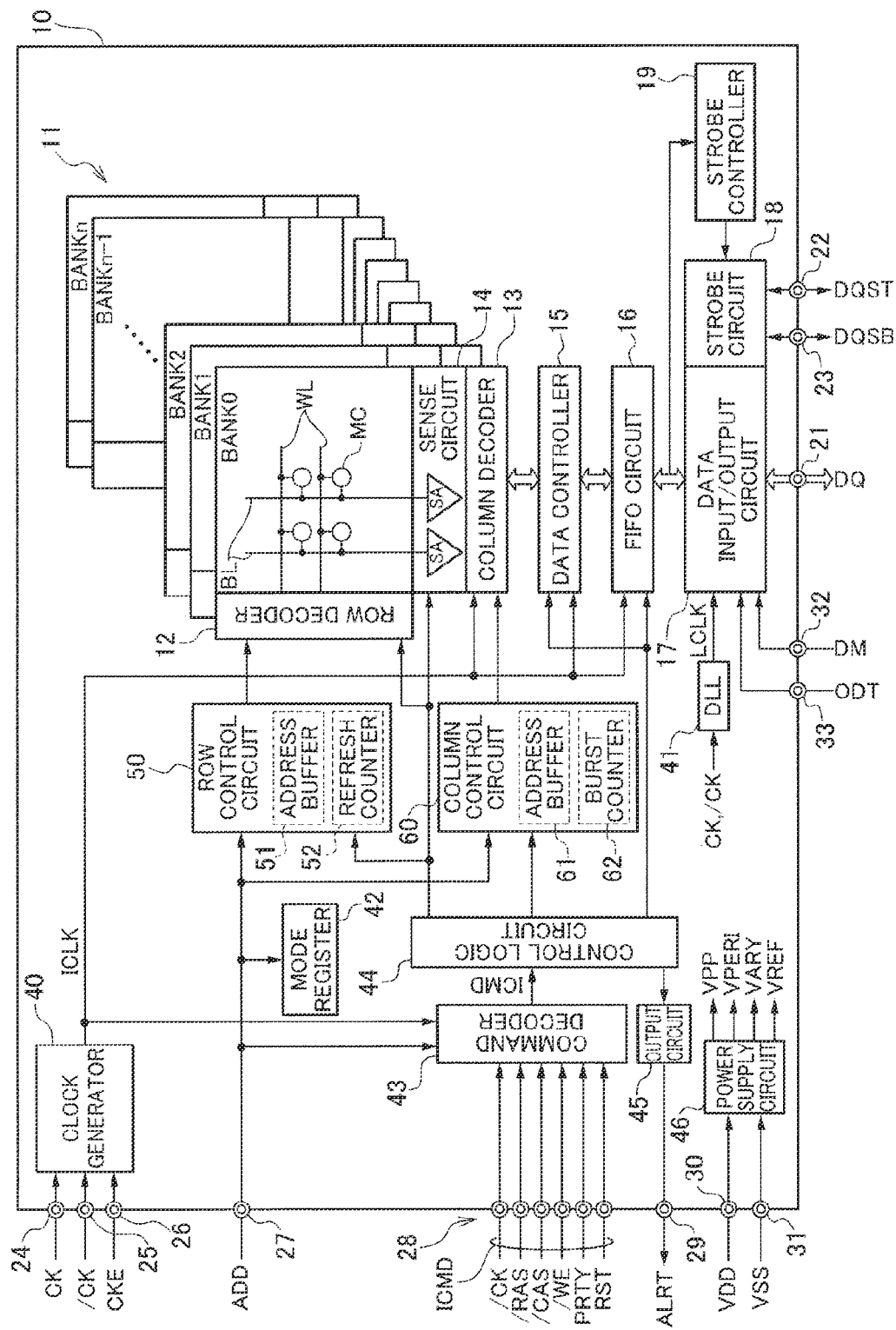
FIG. 1 is a block diagram showing the entire structure of a semiconductor device according to an embodiment of the present invention.

Turning to FIG. 1, the semiconductor device 10 according to this embodiment is DRAM integrated on single semiconductor chip, and includes a memory cell array 11 that is divided into n+1 banks. The bank is a unit capable of executing a command independently, and basically, non-exclusive operation is possible between the banks.

The memory cell array 11 is provided with a plurality of word lines WL and a plurality of bit lines BL that are intersecting each other, and memory cells MC are arranged at points of the intersection. The word line WL is selected by a row decoder 12 and the bit line BL is selected by a column decoder 13. The bit lines BL are respectively connected to corresponding sense amplifiers SA in a sense circuit 14, and the bit line BL that is selected by the column decoder 13 is connected to a data controller 15 via the sense amplifier SA. The data controller 15 is connected to a data input/output circuit 17 via a FIFO circuit 16. The data input/output circuit 17 is a circuit block for inputting/outputting data via a data terminal 21.

The semiconductor device 10 has further external terminals such as strobe terminals 22 and 23, clock terminals 24 and 25, a clock enable terminal 26, an address terminal 27, command terminals 28, an alert terminal 29, power supply terminals 30 and 31, a data mask terminal 32, an ODT terminal 33 and the like.

The strobe terminals 22 and 23 are terminals for inputting/outputting strobe signals DQST and DQSB, respectively. The strobe signals DQST and DQSB are complementary to each other, and define input/output timing of the data to be inputted/outputted via the data terminal 21. Specifically, the strobe signals DQST and DQSB are supplied to a strobe circuit 18 when the data is inputted, that is, during write operation, and based on these signals, the strobe circuit 18 controls operation timing of the data input/output circuit 17. Write data that is inputted via the data terminal 21 is thus received into the data input/output circuit 17 in synchronism with the strobe signals DQST and DQSB. On the other hand, when the data is outputted, that is, during read operation, a strobe controller 19 controls operation of the strobe circuit 18. Read data is thus outputted from the data input/output circuit 17 in synchronism with the strobe signals DQST and DQSB.

The clock terminals 24 and 25 are supplied with external clock signals CK and /CK, respectively. The external clock signals CK and /CK are transferred to a clock generator 40.

The signal having "/" before the signal name herein means that the signal is a low active signal or an inverted signal of the corresponding signal. Therefore, the external clock signals CK and /CK are complementary to each other. The clock generator 40 is activated based on a clock enable signal CKE that is supplied via the clock enable terminal 26, to generate an internal clock signal ICLK. The external clock signals CK and /CK that are supplied via the clock terminals 24 and 25 are also supplied to a DLL circuit 41. The DLL circuit 41 is a circuit to generate an output clock signal LCLK that is phase-controlled based on the external clock signals CK and /CK. The output clock signal LCLK is used as a timing signal defining output timing of the read data DQ from the data input/output circuit 17.

The address terminal 27 is supplied with an address signal ADD. The address signal ADD supplied to the address terminal 27 is transferred to a row control circuit 50, a column control circuit 60, a mode register 42, a command decoder 43 and the like. The row control circuit 50 includes an address buffer 51, a refresh counter 52 and the like, and controls the row decoder 12 based on the row address. Further, the column control circuit 60 includes an address buffer 61, a burst counter 62 and the like, and controls the column decoder 13 based on the column address. When a mode register set command is issued, the address signal ADD is supplied to the mode register 42 so as to update the contents of the mode register 42. Impedance codes RONC, ODTC, as will be described later, and the like are also set in the mode register 42.

The command terminals 28 are supplied with a chip select signal /CS, a row address strobe signal /RAS, a column address strobe signal /CAS, a write enable signal /WE, a parity signal PRTY, a reset signal RST and the like. These command signals CMD are transferred to the command decoder 43 and, based on these command signals CMD, the command decoder 43 generates an internal command signal ICMD. The internal command signal ICMD is supplied to a control logic circuit 44. Based on the internal command signal ICMD, the control logic circuit 44 controls operation of the row control circuit 50, the column control circuit 60 and the like.

The command decoder 43 includes a not-shown verification circuit. The verification circuit verifies the address signal ADD and the command signal CMD based on the parity signal PRTY and, if an error is found in the address signal ADD or the command signal CMD as a result of the verification, outputs an alert signal ALRT via the control logic circuit 44 and an output circuit 45. The alert signal ALRT is outputted to the outside via the alert terminal 29.

The power supply terminals 30 and 31 are supplied with power supply potentials VDD and VSS, respectively. The power supply potentials VDD and VSS are supplied to a power supply circuit 46. The power supply circuit 46 is a circuit block to generate various internal potentials based on the power supply potentials VDD and VSS. The internal potentials generated by the power supply circuit 46 include a boosting potential VPP, a power supply potential VPERI, an array potential VARY, a reference potential VREF and the like. The boosting potential VPP is generated by boosting the power supply potential VDD, and the power supply potential VPERI, the array potential VARY and the reference potential VREF are generated by stepping down the power supply potential VDD.

The boosting potential VPP is mainly used in the row decoder 12. The row decoder 12 drives the word line WL, selected based on the address signal ADD, to the VPP level, to thereby allow a cell transistor included in the memory cell MC to conduct. The array potential VARY is mainly used in the sense circuit 14. When the sense circuit 14 is activated, one of a bit line pair is driven to the VARY level and the other is driven to the VSS level, so as to amplify the read data that is read out from the selected memory cell MC. The power supply potential VPERI is used to most peripheral circuits including the row control circuit 50, the column control circuit 60 and the like. As the power supply potential VPERI, whose voltage is lower than that of the power supply potential VDD, is used to these peripheral circuits, it is possible to reduce power consumption of the semiconductor device 10. Further, the reference potential VREF is a potential used in the data input/output circuit 17.

The data mask terminal 32 and the ODT terminal 33 are supplied with a data mask signal DM and a termination signal ODT, respectively. The data mask signal DM and the termination signal ODT are supplied to the data input/output circuit 17. The data mask signal DM is activated when masking a part of the write data and the read data, and the termination signal ODT is activated when using an output buffer included in the data input/output circuit 17 as a termination resistor.

The entire structure of the semiconductor device 10 according to this embodiment has been described thus far. Focusing on the data input/output circuit 17, the semiconductor device 10 of this embodiment will be explained in more detail as below.

Figure 2:
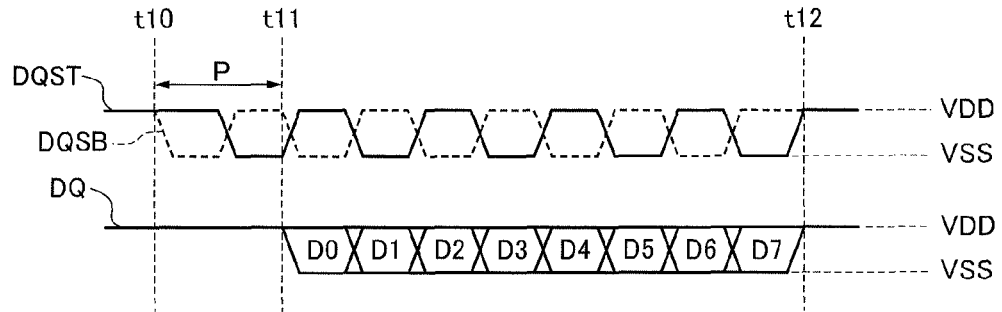
FIG. 2 is a timing chart showing waveforms of a read data and strobe signals during a read operation.

Turning to FIG. 2, a burst length is eight bits and the read data DQ is outputted serially during a period from a time t11 to a time t12. Here, the burst length means the number of bits of the data DQ outputted (or inputted) serially based on one column access. This basically corresponds to the number of the so-called pre-fetches, and is eight bits in DDR4 (Double Data Rate 4) SDRAM (Synchronous DRAM).

As shown in FIG. 2, the level of the data terminal 21 to output the read data DQ is fixed to the VDD level before the time t11. Similarly, the levels of the strobe terminals 22 and 23 to be output the strobe signals DQST and DQSB are also fixed to the VDD level. Clocking of the strobe signals DQST and DQSB is started from a time t10 that is earlier than the time t11 when burst output is started. The clocking of the strobe signals DQST and DQSB means the state in which the strobe signals DQST and DQSB become signals complementary to each other, one being the VDD level and the other being the VSS level, and the signal levels are inverted for every ½ clock cycle. A period P from the time t10 to the time 11 corresponds to a preamble period before executing the burst output of the read data DQ. According to the present embodiment, the time t10 when the clocking of the strobe signals DQST and DQSB is started may be referred to as "preparation timing", and the time t11 when the burst output is started may be referred to as "start timing".

At the time t11, the read data DQ is subjected to the burst output in synchronism with the clocking of the strobe signals DQST and DQSB. In FIG. 2, eight bits consisting of D0 to D7 are subjected to the burst output in this order. When the burst output is completed at the time t12, the levels of the terminals 21 to 23 return to the VDD level.

Thus, according to this embodiment, the level of the data terminal 21 is fixed to the VDD level except for the period when the read data DQ is subjected to the burst output (time t11 to time t12). Especially, when the termination signal ODT is activated before the time t10, the data terminal 21 is driven to the VDD level at a predetermined impedance. When the termination signal ODT is not activated before the time t10, on the other hand, the data terminal 21 is made to be in a high impedance state. Then the level of the data terminal 21 is driven to the VDD level by a device other than the semiconductor device 10. Although the ODT operation is not necessary during the period from the time t10 to the time t11, it is necessary that the data terminal 21 has the VDD level.

Figure 3:
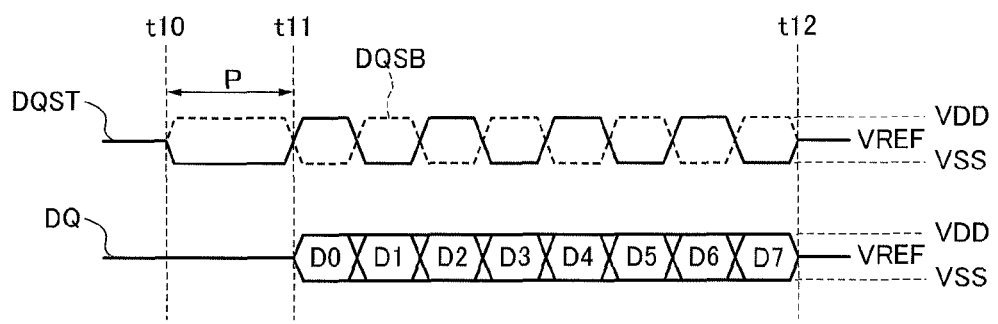
FIG. 3 is a timing chart showing waveforms that the inventors have conceived as a prototype in the course of making the present invention.

Turning to FIG. 3, that shows waveforms of the prototype, the level of the data terminal 21 is fixed to the VREF level before the time t11. The VREF level is an intermediate level between the VDD level and the VSS level, which can be defined as follows:

$$VREF=(VDD+VSS)/2$$

Similarly, the strobe signals DQST and DQSB are also fixed to the VREF level before the time t10. The clocking of the strobe signals DQST and DQSB is performed during the period from the time t10 to the time t12.

Figure 4:
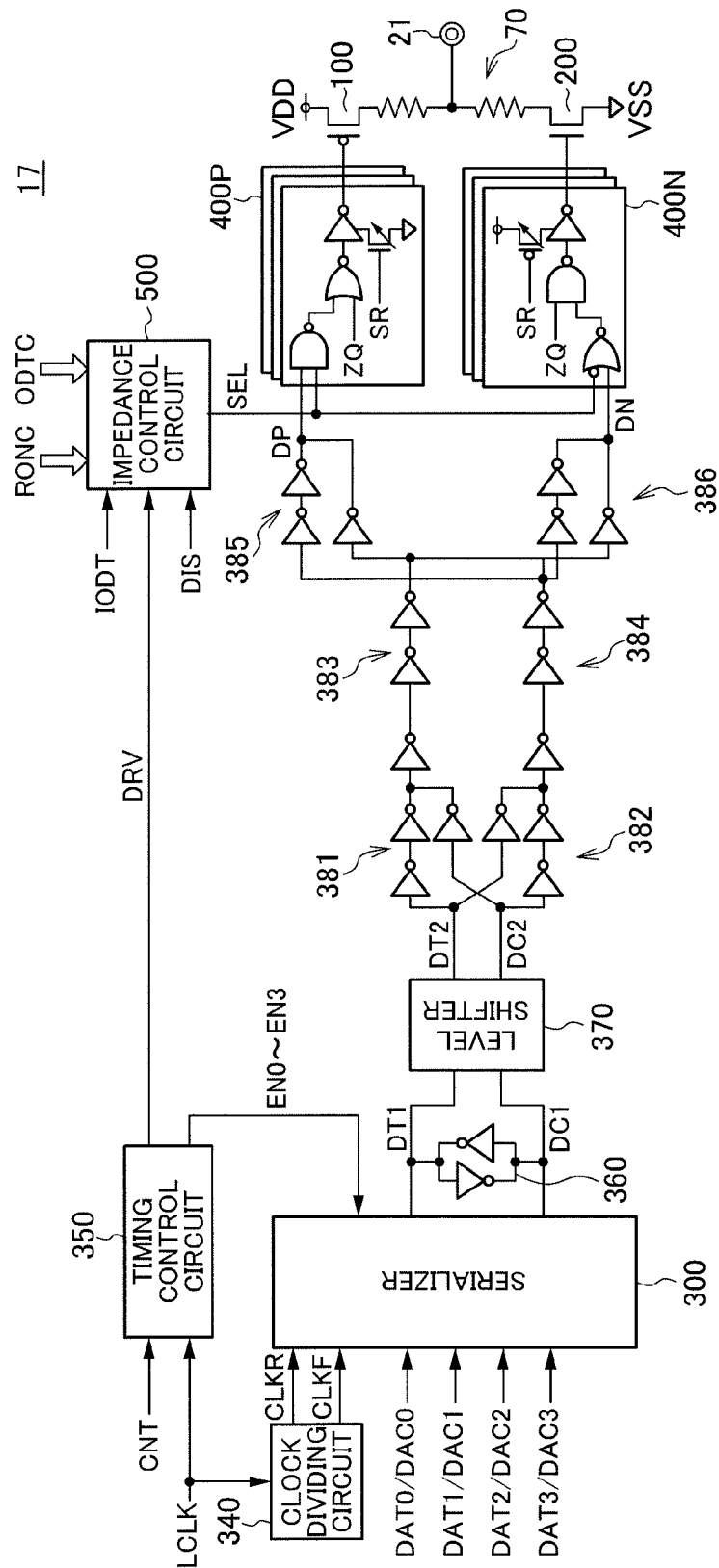
FIG. 4 is a circuit diagram showing an essential part of the data input/output circuit shown in FIG. 1.

As shown in FIG. 4, the data input/output circuit 17 includes an output buffer circuit 70 having a pull-up buffer circuit 100 and a pull-down buffer circuit 200. The pull-up buffer circuit 100 is connected between a power supply line supplying the power supply potential VDD and the data terminal 21, and the pull-down buffer circuit 200 is connected between a power supply line supplying the ground potential VSS and the data terminal 21. In FIG. 4, the pull-up buffer circuit 100 is illustrated by a symbol of one p-channel MOS transistor, but in actuality, it has a plurality of p-channel MOS transistors connected in parallel. Similarly, in FIG. 4, the pull-down buffer circuit 200 is illustrated by a symbol of one n-channel MOS transistor, but in actuality, it has a plurality of n-channel MOS transistors connected in parallel. Detailed circuit structures of the pull-up buffer circuit 100 and the pull-down buffer circuit 200 will be described later.

The power supply line supplying the power supply potential VDD is referred to as a "first power supply line" and the power supply line supplying the ground potential VSS is referred to as a "second power supply line". The pull-up buffer circuit 100 is referred to as a "first buffer circuit" and the pull-down buffer circuit 200 is referred to as a "second buffer circuit".

The data input/output circuit 17 is provided with a serializer 300 that performs on-off control of the pull-up buffer circuit 100 and the pull-down buffer circuit 200. The serializer 300 converts internal data signals DAT0/DAC0 to DAT3/DAC3 that are supplied in parallel and are complementary to each other into serial complementary data DT1/DC1. The internal data signals DAT0/DAC0 to DAT3/DAC3 are the internal read data read out from the memory cell array 11, and are supplied to the serializer 300 via the data controller 15 and the FIFO circuit 16.

The serializer 300 is referred to as a "first control circuit", the internal data signal DT1 outputted from the serializer 300 is referred to as a "first internal data signal", and the data signal DC1 that is complementary to the internal data signal DT1 is referred to as a "second internal data signal".

Figure 5:
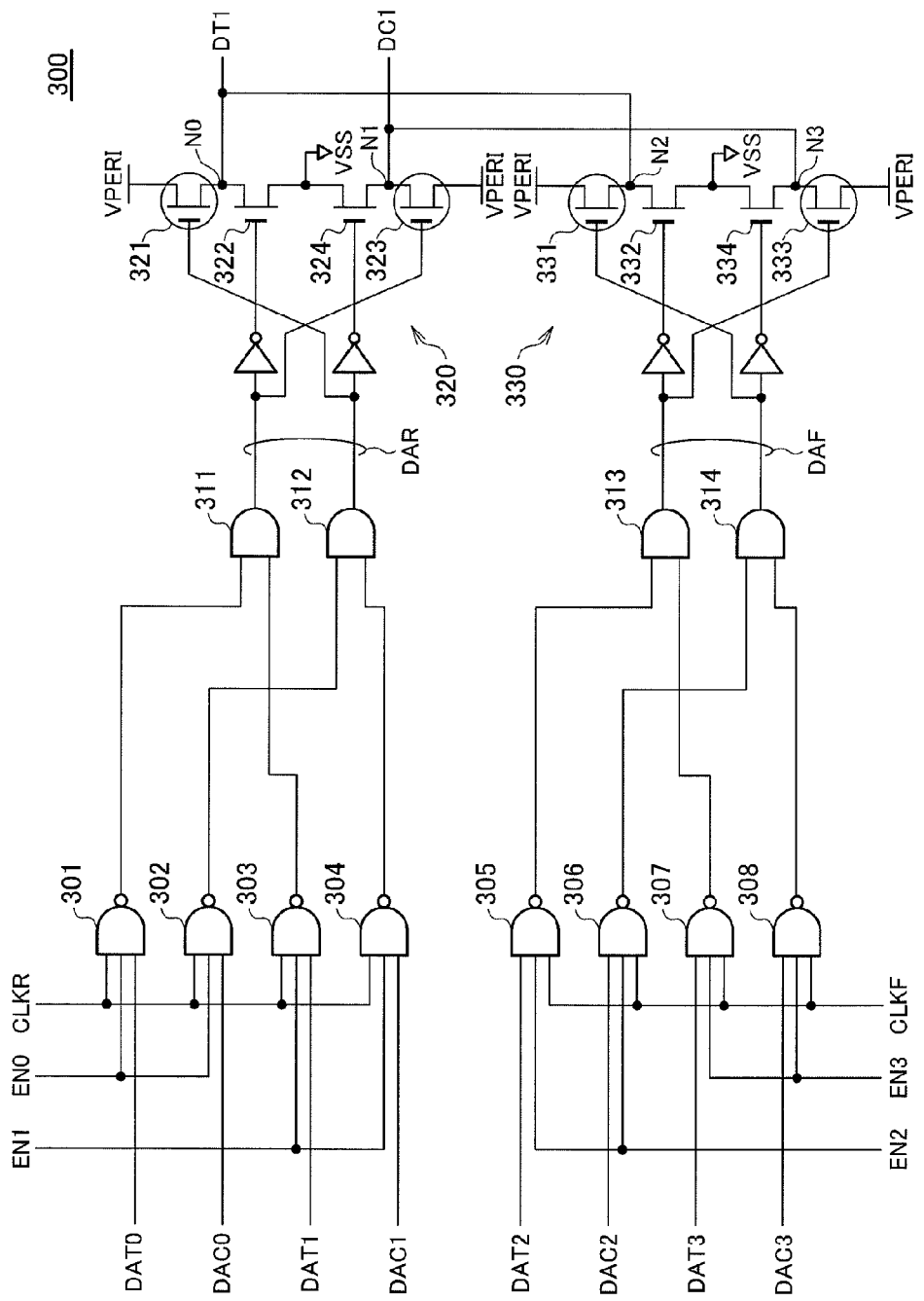
FIG. 5 is a circuit diagram of the serializer shown in FIG. 4.

Turning to FIG. 5, the serializer 300 includes three-input NAND gate circuits 301 to 308, two-input AND gate circuits 311 to 314, and tri-state buffer circuits 320 and 330. The corresponding internal data signals DAT0/DAC0 to DAT3/DAC3 are respectively supplied to first input nodes of the NAND gate circuits 301 to 308. A rising clock signal CLKR is supplied to second input nodes of the NAND gate circuits 301 to 304, and a falling clock signal CLKF is supplied to second input nodes of the NAND gate circuits 305 to 308. Further, an enable signal EN0 is supplied to third input nodes of the NAND gate circuits 301 and 302, an enable signal EN1 to third input nodes of the NAND gate circuits 303 and 304, an enable signal EN2 to third input nodes of the NAND gate circuits 305 and 306, and an enable signal EN3 to third input nodes of the NAND gate circuits 307 and 308.

The rising clock signal CLKR and the falling clock signal CLKF are complementary to each other, and generated by a clock dividing circuit 340 shown in FIG. 4. The clock dividing circuit 340 generates the rising clock signal CLKR and the falling clock signal CLKF that are complementary to each other based on the output clock signal LCLK generated by the DLL circuit 41.

The enable signals EN0 to EN3 are generated by a timing control circuit 350 shown in FIG. 4. The timing control circuit 350 is a circuit block that generates various signals in synchronism with the output clock signal LCLK based on a control signal CNT. The signals generated by the timing control circuit 350 include a drive signal DRV, other than the enable signals EN0 to EN3. At least the enable signal EN0 and the enable signal EN1 are not activated simultaneously, and the enable signal EN2 and the enable signal EN3 are not activated simultaneously. Accordingly, only one output signal of the NAND gate circuits 301 to 308 becomes the low level, and all of the remaining seven output signals become the high level.

The output signals of the NAND gate circuits 301 to 308 are supplied to corresponding input nodes of the AND gate circuits 311 to 314. Specifically, the output signals of the NAND gate circuits 301 and 303 are supplied to the AND gate circuit 311, the output signals of the NAND gate circuits 302 and 304 to the AND gate circuit 312, the output signals of the NAND gate circuits 305 and 307 to the AND gate circuit 313, and the output signals of the NAND gate circuits 306 and 308 to the AND gate circuit 314. Thereby, only one output signal of the AND gate circuits 311 to 314 becomes the low level, and all of the remaining three output signals become the high level.

Output signals DAR of the AND gate circuits 311 and 312 are supplied to the tri-state buffer circuit 320, and output signals DAF of the AND gate circuits 313 and 314 are supplied to the tri-state buffer circuit 330.

The tri-state buffer circuit 320 includes a p-channel MOS transistor 321 and an n-channel MOS transistor 322 that are connected in series between the power supply potential VPERI and the ground potential VSS, and a p-channel MOS transistor 323 and an n-channel MOS transistor 324 that are connected in series between the power supply potential VPERI and the ground potential VSS. The output signal of the AND gate circuit 312 is supplied to a gate electrode of the transistor 321, an inverted signal of the output signal of the AND gate circuit 311 is supplied to a gate electrode of the transistor 322, the output signal of the AND gate circuit 311 is supplied to a gate electrode of the transistor 323, and an inverted signal of the output signal of the AND gate circuit 312 is supplied to a gate electrode of the transistor 324. The signal DT1 as one of the complementary data is outputted from a node N0 that is a contact node between the transistors 321 and 322, and the signal DC1 as the other of the complementary data is outputted from a node N1 that is a contact node between the transistors 323 and 324.

The tri-state buffer circuit 330 includes a p-channel MOS transistor 331 and an n-channel MOS transistor 332 that are connected in series between the power supply potential VPERI and the ground potential VSS, and a p-channel MOS transistor 333 and an n-channel MOS transistor 334 that are connected in series between the power supply potential VPERI and the ground potential VSS. The output signal of the AND gate circuit 314 is supplied to a gate electrode of the transistor 331, an inverted signal of the output signal of the AND gate circuit 313 is supplied to a gate electrode of the transistor 332, the output signal of the AND gate circuit 313 is supplied to a gate electrode of the transistor 333, and an inverted signal of the output signal of the AND gate circuit 314 is supplied to a gate electrode of the transistor 334. The signal DT1 as one of the complementary data is outputted from a node N2 that is a contact node between the transistors 331 and 332, and the signal DC1 as the other of the complementary data is outputted from a node N3 that is a contact node between the transistors 333 and 334.

The node N0 of the tri-state buffer circuit 320 and the node N2 of the tri-state buffer circuit 330 are subjected to wired OR connection. Similarly, the node N1 of the tri-state buffer circuit 320 and the node N3 of the tri-state buffer circuit 330 are subjected to wired OR connection.

As described above, only one of the output signals of the AND gate circuits 311 to 314 becomes the low level, and all of the remaining three output signals become the high level. Accordingly, only one p-channel MOS transistor and one n-channel MOS transistor are always turned on, among the transistors constituting the tri-state buffer circuits 320 and 330, and all of the remaining transistors are turned off. When, for example, the output signal of the AND gate circuit 311 is the low level, only the transistors 322 and 323 are turned on, and therefore the node N0 is driven at the low level and the node N1 is driven at the high level. At this time, the nodes N2 and N3 of the tri-state buffer circuit 330 are in a high impedance state.

When the enable signals EN0 to EN3 are activated to the high level one by one according to the above-described structure, the internal data signals DAT0/DAC0 to DAT3/DAC3 that are inputted in parallel and are complementary to each other are converted by the serializer 300 into the serial complementary data DT1/DC1. During the period to output the read data DQ, the complementary data DT1/DC1 control the pull-up buffer circuit 100 and the pull-down buffer circuit 200 in such a manner that one of these is turned on and the other is turned off based on a logic level of the read data DQ to be outputted. Meanwhile, during the period when the read data DQ is not outputted, that is, during the periods before and after outputting the read data DQ, the logic of the complementary data DT1/DC1 is fixed so that the pull-up buffer circuit 100 is turned on and the pull-down buffer circuit 200 is turned off. The circuit structure and the function of the serializer 300 have been described thus far.

Turning back to FIG. 4, the complementary data DT1/DC1 are latched by a latch circuit 360 and level-shifted by a level shifter 370. The level shifter 370 is a circuit for shifting amplitude of the complementary data DT1/DC1 from the VPERI level to the VDD level. This is because the amplitude of the read data DQ to be outputted to the outside of the semiconductor device 10 needs to have the VDD level that is equal to the external voltage, whereas the amplitude of the internal signals has the VPERI level. The complementary data DT2/DC2 outputted from the level shifter 370 are phase-compensated by compensation circuits 381 and 382 and thereafter, transmitted via lines 383 and 384.

Specifically, the latch circuit 360 synthesizes an inverted signal (positive-phase signal) of the internal data signal DC1 (negative-phase signal) with the internal data signal DT1 (positive-phase signal), and synthesizes an inverted signal (negative-phase signal) of the internal data signal DT1 (positive-phase signal) with the internal data signal DC1 (negative-phase signal). The latch circuit 360 is referred to as an "adjustment circuit". The amplitude value of the internal data signal DT1 (first internal data signal) is converted to the VDD level by the level shifter 370 to become an internal data signal DT2. The internal data signal DT2 is referred to as a "third internal data signal". Similarly, the amplitude value of the internal data signal DC1 (second internal data signal) is converted to the VDD level by the level shifter 370 to become an internal data signal DC2. The internal data signal DC2 is referred to as a "fourth internal data signal". The internal data signal DT1 and the internal data signal DC1 are complementary to each other, and therefore, the internal data signal DT2 and the internal data signal DC2 are also complementary to each other.

The complementary data DT1/DC1 (complementary data DT2/DC2) are binary signals, one of which has the high level and the other has the low level at all times. Therefore, a pair of the complementary signals can represent one-bit data only. This means that only the following two ways can be specified by the complementary data DT1/DC1 (complementary data DT2/DC2), that is, either the pull-up buffer circuit 100 is turned on and the pull-down buffer circuit 200 is turned off or the pull-up buffer circuit 100 is turned off and the pull-down buffer circuit 200 is turned on. In other words, it is impossible for the complementary data DT1/DC1 (complementary data DT2/DC2) to turn on or off both of the pull-up buffer circuit 100 and the pull-down buffer circuit 200. Operation for turning on and off both of the buffer circuits 100 and 200, that is, enabling operation of the buffer circuits 100 and 200 is performed by an impedance control circuit 500 that will be described later.

The complementary data DT2/DC2 transmitted via the lines 383 and 384 are converted into single-ended control signals DP and DN by regenerative circuits 385 and 386. The control signal DP is supplied to an output control circuit 400P, and the control signal DN is supplied to an output control circuit 400N. The output control circuit 400P is a circuit block for controlling the pull-up buffer circuit 100, and the output control circuit 400N is a circuit block for controlling the pull-down buffer circuit 200. In FIG. 4, the output control circuits 400P and 400N are represented by some gate circuit symbols, which are images for explaining functions of the output control circuits 400P and 400N and are not representing the actual circuit structures. According to the present embodiment, the output control circuits 400P and 400N may be referred to as "fourth control circuits".

Figure 6:
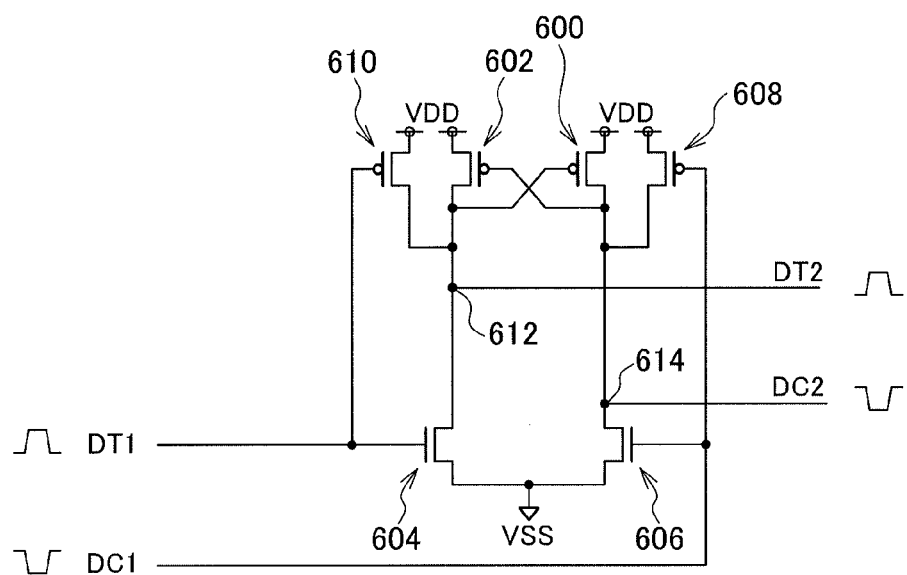
FIG. 6 is a circuit diagram of the level shifter shown in FIG. 4.

Turning to FIG. 6, the level shifter 370 includes cross-coupled p-channel (first conductivity type) MOS transistors 600 and 602 that have sources connected to the external power supply potential VDD, and n-channel (second conductivity type) MOS transistors 606 and 604 that have sources being connected to the ground potential VSS and that are connected in series to the transistors 600 and 602, respectively. A pathway from the external power supply potential VDD through the transistors 602 and 604 to the ground potential VSS is referred to as a "first pathway", and a pathway from the external power supply potential VDD through the transistors 600 and 606 to the ground potential VSS is referred to as a "second pathway".

The internal data signal DT2 is outputted from a connection node 612 (first connection node) between the transistors 602 and 604 in the first pathway, and the internal data signal DC2 is outputted from a connection node 614 (second connection node) between the transistors 600 and 606 in the second pathway. A gate potential of the transistor 604 in the first pathway is controlled by the internal data signal DT1, and a gate potential of the transistor 606 in the second pathway is controlled by the internal data signal DC1.

Further, a p-channel MOS transistor 610 is connected between the external power supply potential VDD and the first connection node 612, and its gate potential is controlled by the internal data signal DT1. Similarly, a p-channel MOS transistor 608 is connected between the external power supply potential VDD and the second connection node 614, and its gate potential is controlled by the internal data signal DC1.

When the data signal DT1 is the high level, the data signal DC1 is the low level, and therefore the transistor 604 is turned on, the transistor 606 is turned off, the transistor 608 is turned on, and the transistor 610 is turned off. Further, the transistor 600 is turned on, and the transistor 602 is turned off. As a result of this, the internal data signal DT2 becomes the high level, and the internal data signal DC2 becomes the low level. Moreover, the voltage of the internal data signals DT2 and DC2 is within a range from VSS to VDD. When the data signal DT1 is the low level, the data signal DC1 becomes the high level, the internal data signal DT2 becomes the low level, and the internal data signal DC2 becomes the high level.

As the data signals DT1/DC1 are complementary to each other, the signals substantially form a one-bit signal. Accordingly, the data signals DT2/DC2 can be simultaneously generated from the data signals DT1/DC1 by the level shifter 370 shown in FIG. 6. A plurality of level shifters 370 are not necessarily required.

A circuit diagram of a modification of the data input/output circuit 17 is explained with reference to FIG. 7.

Figure 7:
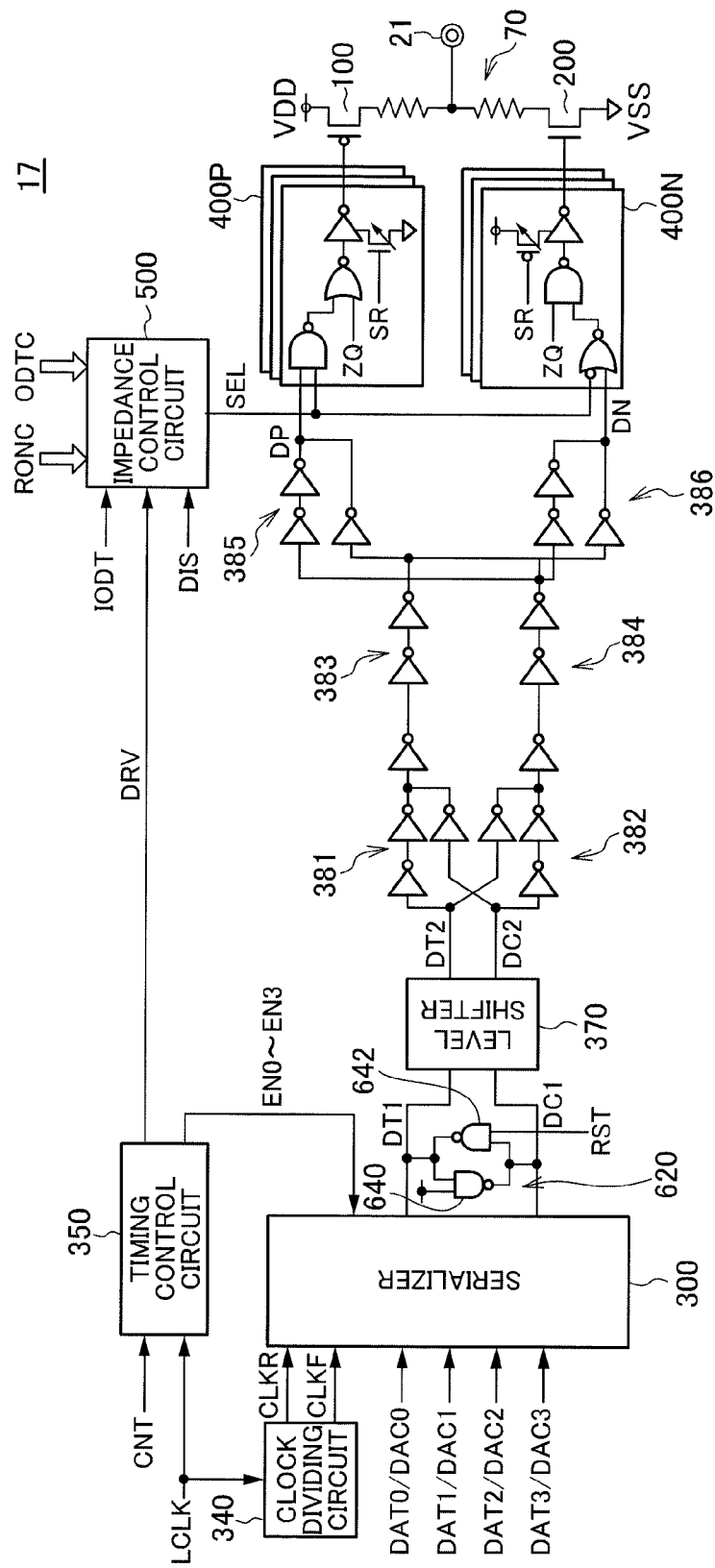
FIG. 7 is a circuit diagram showing a modification of the data input/output circuit shown in FIG. 1.

A modification of the data input/output circuit 17 shown in FIG. 7 is different from FIG. 4 in that the latch circuit 360 is replaced by a latch circuit 620. In the latch circuit 620, two-input NAND circuits 640 and 642 synthesize the signals. One of the input nodes of the NAND circuit 640 is supplied with the internal data signal DT1, and the other of the input nodes of the NAND circuit 640 is fixed to the power supply potential VPERI. Output signal of the NAND circuit 640 is synthesized with the internal data signal DC1. Similarly, one of the input nodes of the NAND circuit 642 is supplied with the internal data signal DC1, and the other of the input nodes of the NAND circuit 640 is supplied with the reset signal RST. Output signal of the NAND circuit 642 is synthesized with the internal data signal DT1. The reset signal RST is a low active signal supplied from the control logic circuit 44. At the time of resetting, the internal data signal DT1 is forcibly set to the high level. At the time of ODT and high impedance setting, the internal data signals DT1 and DT2 having the high level are supplied to the pull-up buffer circuit 100, and fine adjustments of the impedance of the pull-up buffer circuit 100 are made further by the impedance control circuit 500. The details will be described later.

Figure 8:
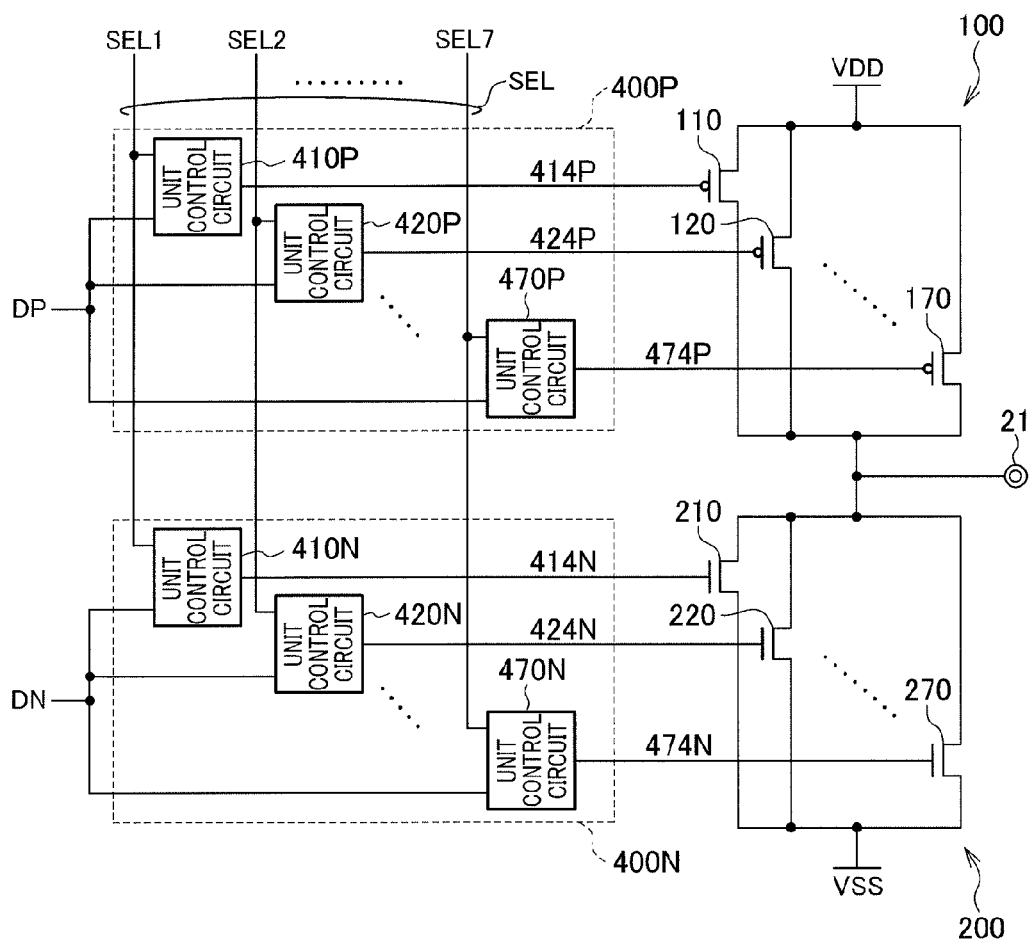
FIG. 8 is a circuit diagram showing the pull-up buffer circuit, the pull-down buffer circuit, and the output control circuits shown in FIG. 4 or FIG. 7.

Turning to FIG. 8, the pull-up buffer circuit 100 includes a plurality of unit buffer circuits that are connected in parallel between the power supply line supplying the power supply potential VDD and the data terminal 21. In this embodiment, the pull-up buffer circuit 100 includes seven unit buffer circuits 110 to 170, although the number is not particularly limited. The seven unit buffer circuits 110 to 170 have the same impedance, and the impedance of the pull-up buffer circuit 100 when it is activated can be selected by selecting the number of the unit buffer circuits to be activated simultaneously. The impedance of the respective unit buffer circuits 110 to 170 is adjusted to a designed value (240Ω for example) by a not-shown calibration circuit. The result of the calibration operation is obtained as a calibration code ZQCP that will be described later. In FIG. 8, each of the unit buffer circuits 110 to 170 is represented by a symbol of a p-channel MOS transistor, but in actuality, each unit buffer circuit does not necessarily consist of one transistor.

Similarly, the pull-down buffer circuit 200 includes a plurality of unit buffer circuits that are connected in parallel between the power supply line supplying the ground potential VSS and the data terminal 21. In this embodiment, the pull-down buffer circuit 200 includes seven unit buffer circuits 210 to 270, although the number is not particularly limited. The seven unit buffer circuits 210 to 270 have the same impedance, and the impedance of the pull-up buffer circuit 200 when it is activated can be selected by selecting the number of the unit buffer circuits to be activated simultaneously. The impedance of the respective unit buffer circuits 210 to 270 is adjusted to a designed value (240Ω for example) by a not-shown calibration circuit. The result of the calibration operation is obtained as a calibration code ZQCN that will be described later. In FIG. 8, each of the unit buffer circuits 210 to 270 is represented by a symbol of an n-channel MOS transistor, but in actuality, each unit buffer circuit does not necessarily consist of one transistor.

The unit buffer circuits 110 to 170 are respectively controlled by unit control circuits 410P to 470P that are included in the output control circuit 400P. The unit control circuits 410P to 470P are controlled by the control signal DP and corresponding selection signals SEL1 to SEL7. Similarly, the unit buffer circuits 210 to 270 are respectively controlled by unit control circuits 410N to 470N that are included in the output control circuit 400N. The unit control circuits 410N to 470N are controlled by the control signal DN and the corresponding selection signals SEL1 to SEL7. The selection signals SEL1 to SEL7 are signals generated by the impedance control circuit 500 shown in FIG. 4.

Figure 9:
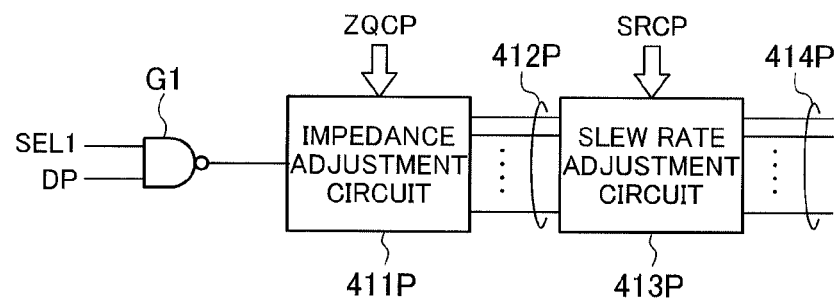
FIG. 9 is a circuit diagram of the unit control circuit 410P shown in FIG. 8.

As shown in FIG. 9, the unit control circuit 410P includes a NAND gate circuit G1 that receives the selection signal SEL1 and the control signal DP, an impedance adjustment circuit 411P that receives an output signal of the gate circuit G1, and a slew rate adjustment circuit 413P that receives an output signals of the impedance adjustment circuit 411P. When the output signal of the gate circuit G1 is activated to the low level, the impedance adjustment circuit 411P activates one or more bits of a control signal 412P consisting of a plurality of bits, based on the calibration code ZQCP. The slew rate adjustment circuit 413P adjusts change speed of the activated bit(s) of the control signal 412P, based on a slew rate code SRCP. The control signal 414P outputted from the slew rate adjustment circuit 413P is supplied to the unit buffer circuit 110.

Other unit control circuits 420P to 470P have the same circuit structure as that of the unit control circuit 410P shown in FIG. 9, except that the corresponding selection signals SEL2 to SEL7 are supplied thereto. The control signals 424P to 474P outputted from the unit control circuits 420P to 470P are supplied to the corresponding unit buffer circuits 120 to 170, respectively.

Figure 10:
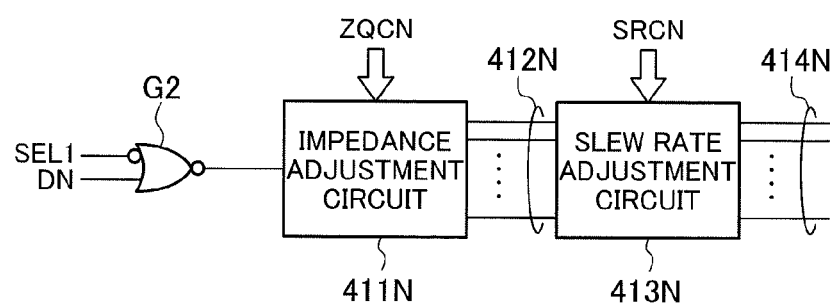
FIG. 10 is a circuit diagram of the unit control circuit 410N shown in FIG. 8.

As shown in FIG. 10, the unit control circuit 410N includes a NAND gate circuit G2 that receives the selection signal SEL1 and the control signal DN, an impedance adjustment circuit 411N that receives an output signal of the gate circuit G2, and a slew rate adjustment circuit 413N that receives an output signals of the impedance adjustment circuit 411N. When the output signal of the gate circuit G2 is activated to the high level, the impedance adjustment circuit 411N activates one or more bits of a control signal 412N consisting of a plurality of bits, based on the calibration code ZQCN. The slew rate adjustment circuit 413N adjusts change speed of the activated bit(s) of the control signal 412N, based on a slew rate code SRCN. The control signal 414N outputted from the slew rate adjustment circuit 413N is supplied to the unit buffer circuit 210.

Other unit control circuits 420N to 470N have the same circuit structure as that of the unit control circuit 410N shown in FIG. 10, except that the respective corresponding selection signals SEL2 to SEL7 are supplied thereto. The control signals 424N to 474N outputted from the unit control circuits 420N to 470N are supplied to the corresponding unit buffer circuits 220 to 270, respectively.

Figure 11:
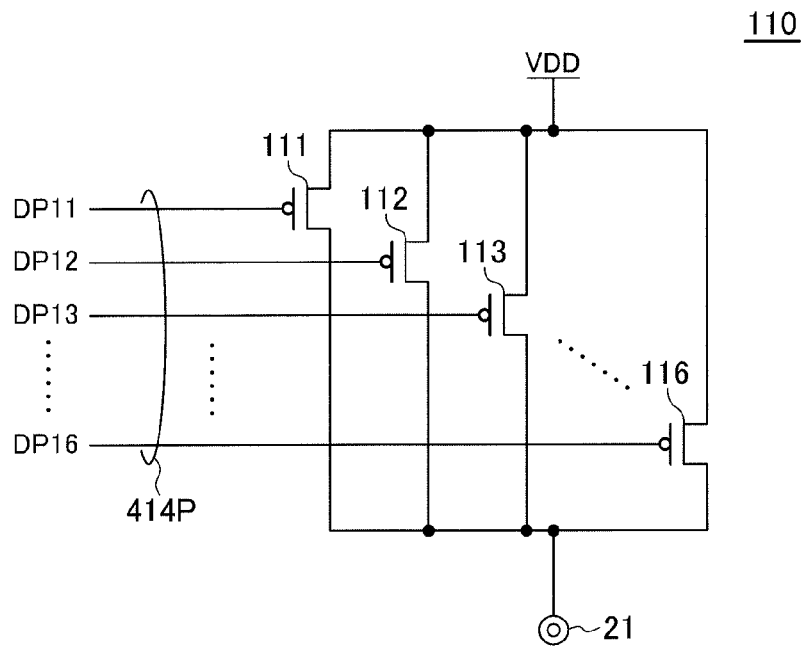
FIG. 11 is a circuit diagram of the unit buffer circuit 110 shown in FIG. 8.

As shown in FIG. 11, the unit buffer circuit 110 includes a plurality of p-channel MOS transistors 111 to 116 connected in parallel between the power supply line supplying the power supply potential VDD and the data terminal 21. Respective bits DP11 to DP16 constituting the control signal 414P are supplied to respective gate electrodes of the transistors 111 to 116. Thereby, the transistor corresponding to the low-level bit is turned on, among the respective bits DP11 to DP16 constituting the control signal 414P. A channel width of each of the transistors 111 to 115, among the transistors 111 to 116, is assigned a weight that is a power of two, although not particularly limited. Thus, on/off of the transistors 111 to 115 is specified based on the impedance code ZQCP. The transistor 116 is turned on without regard for the impedance code ZQCP.

Other unit buffer circuits 120 to 170 have the same circuit structure as that of the unit buffer circuit 110, except that the corresponding control signals 424P to 474P are supplied thereto.

Figure 12:
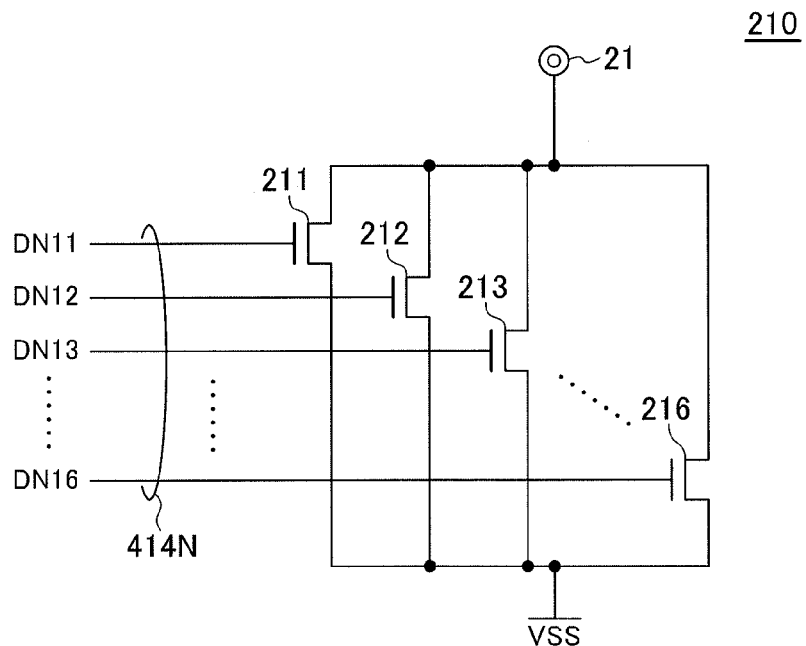
FIG. 12 is a circuit diagram of the unit buffer circuit 210 shown in FIG. 8.

As shown in FIG. 12, the unit buffer circuit 210 includes a plurality of n-channel MOS transistors 211 to 216 connected in parallel between the power supply line supplying the ground potential VSS and the data terminal 21. Respective bits DN11 to DN16 constituting the control signal 414N are supplied to respective gate electrodes of the transistors 211 to 216. Thereby, the transistor corresponding to the high-level bit is turned on, among the respective bits DN11 to DN16 constituting the control signal 414N. A channel width of each of the transistors 211 to 215, among the transistors 211 to 216, is assigned a weight that is a power of two, although not particularly limited. Thus, on/off of the transistors 211 to 215 is specified based on the impedance code ZQCN. The transistor 216 is turned on without regard for the impedance code ZQCN.

Other unit buffer circuits 220 to 270 have the same circuit structure as that of the unit buffer circuit 210, except that the corresponding control signals 424N to 474N are supplied thereto respectively.

Figures 13, 14:
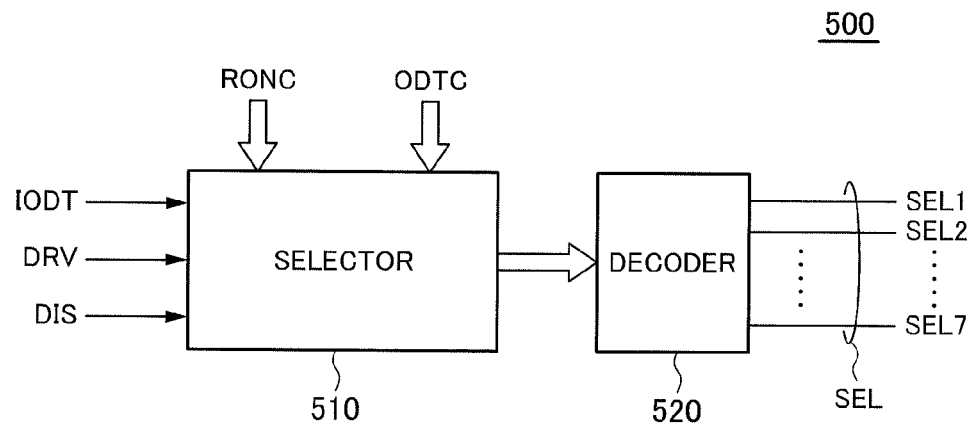
FIG. 13 is a block diagram showing the structure of the impedance control circuit shown in FIG. 4 or FIG. 7.
FIG. 14 is a truth table for explaining the selector shown in FIG. 13.

Turning to FIG. 13, the impedance control circuit 500 includes a selector 510 that receives the impedance codes RONC and ODTC, and a decoder 520 that decodes an output signals of the selector 510. The impedance code RONC is a signal that specifies the impedance when the pull-up buffer circuit 100 and the pull-down buffer circuit 200 are allowed to function as output circuits. Meanwhile, the impedance code ODTC is a signal that specifies the impedance when the pull-up buffer circuit 100 is allowed to function as a termination resistor. The pull-up buffer circuit 100 is allowed to function as the termination resistor when the termination signal ODT inputted in the ODT terminal 33 shown in FIG. 1 is activated. In this embodiment, the data terminal 21 has the termination level of VDD, and hence the pull-down buffer circuit 200 is not used as the termination resistor. The impedance codes RONC and ODTC need not to be fixed and preferably may be switched according to a set value of the mode register 42.

A termination signal IODT, a drive signal DRV and a disable signal DIS supplied to the selector are used to determine which of the impedance codes RONC and ODTC to be selected. The termination signal IODT is a signal activated to the low level in performing the ODT operation, and activated based on the termination signal ODT inputted into the ODT terminal 33. The drive signal DRV is a signal activated to the high level in performing output operation of the read data DQ. The disable signal DIS is a signal activated when the output buffer circuit 70 is made to be in the high impedance state. The impedance code RONC or ODTC is selected according to a truth table shown in FIG. 14. In this embodiment, the state in which the impedance code ODTC is selected may be referred to as a "first control state", and the state in which the impedance code RONC is selected may be referred to as a "second control state". Further, the impedance control circuit 500 may be referred to as a "second control circuit".

The drive signal DRV is a signal generated by the timing control circuit 350 shown in FIG. 4. By activating the drive signal DRV in synchronism with an output timing of the read data DQ, the timing control circuit 350 switches the output buffer circuit 70 that is performing the ODT operation to perform the output operation of the read data DQ, or switches the output buffer circuit 70 that is in the high impedance state to perform the output operation of the read data DQ. It is needless to say that the opposite control is also possible, that is, the output buffer circuit 70 that is performing the output operation of the read data DQ may be switched to perform the ODT operation, or to be in the high impedance state. According to the present embodiment, the timing control circuit 350 may be referred to as a "third control circuit".

The impedance code RONC or ODTC that is selected by the selector 510 is supplied to the decoder 520. Based on the impedance code, the decoder 520 controls the number of the selection signals SEL1 to SEL7 to be activated. As described above, the selection signals SEL1 to SEL7 are signals for activating the corresponding unit buffer circuits 110 to 170 and 210 to 270, respectively. As the number of the selection signals SEL1 to SEL7 to be activated increases, the impedance of the pull-up buffer circuit 100 or the pull-down buffer circuit 200 in the on-state is reduced. According to the present invention, the selection signals SEL1 to SEL7 may be referred to as "second control signals".

Figure 15:
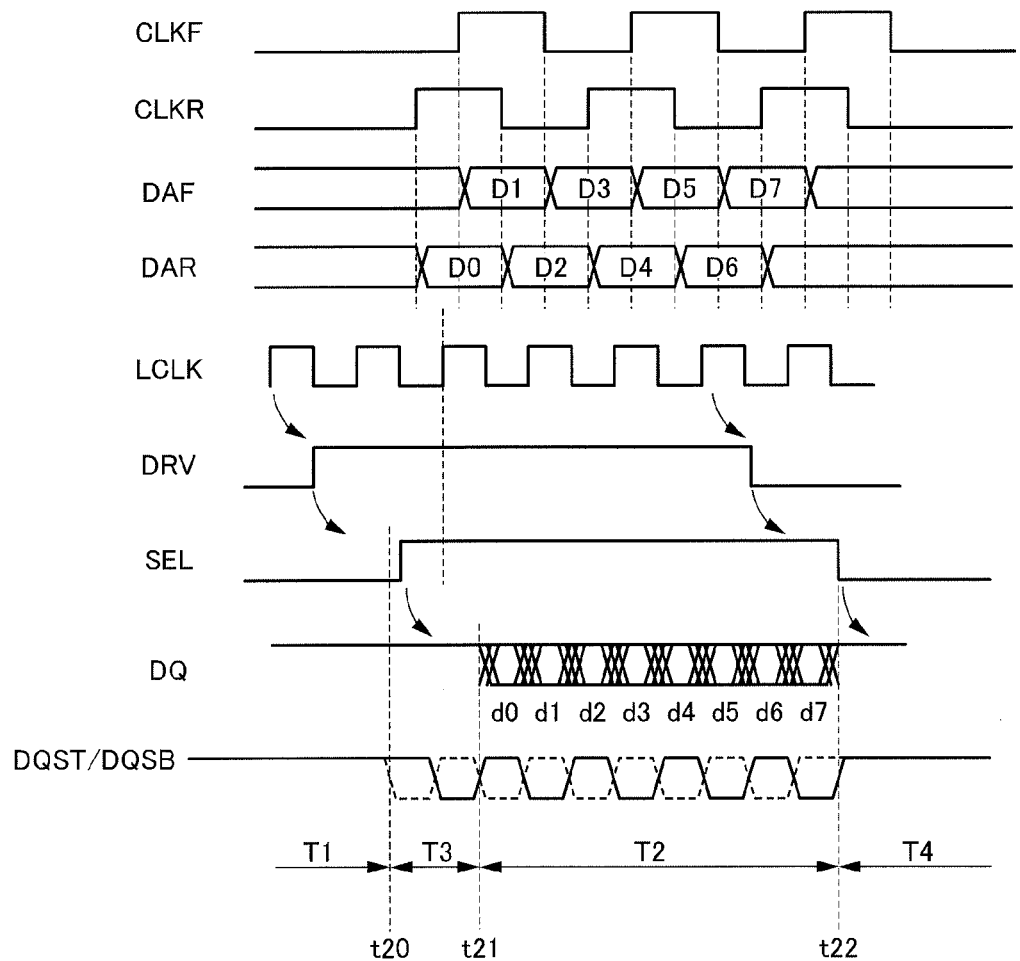
FIG. 15 is a timing chart for explaining the output operation of the read data according to one example.

According to one example shown in FIG. 15, the clocking of the strobe signals DQST/DQSB is started at a time t20, and the output of the read data DQ is started from a time t21 that is one clock cycle after the time t20. The output operation of the read data DQ is completed at a time t22. Therefore, the data terminal 21 needs to have the VDD level in control periods T1 and T3 before the time t21 and a control period T4 after the time t22.

In order to achieve this, it is necessary to perform the ODT operation by turning on the pull-up buffer circuit 100 only, or to allow the data terminal 21 to be in the high impedance state by turning off both of the pull-up buffer circuit 100 and the pull-down buffer circuit 200, during the control periods T1, T3 and T4. In performing the ODT operation, the impedance of the pull-up buffer circuit 100 needs to be controlled based on the impedance code ODTC. As described above, the impedance is controlled based on the impedance code ODTC by selecting the number of the unit buffer circuits 110 to 170 to be activated.

Meanwhile, during a control period T2 between the time t21 to the time t22, it is necessary to turn on either one of the pull-up buffer circuit 100 and the pull-down buffer circuit 200 and turn off the other, based on the logic level of the read data DQ to be outputted. In the output operation of the read data DQ, the impedance of the pull-up buffer circuit 100 needs to be controlled based on the impedance code RONC. The impedance is also controlled based on the impedance code RONC by selecting the number of the unit buffer circuits 110 to 170 and 210 to 270 to be activated.

Here, the timing to start the output of the read data DQ needs to coincide with the time 21 with precision. Such timing control is performed precisely by the serializer 300. On the other hand, it is not necessarily required to coincide the timing to switch the impedance of the pull-up buffer circuit 100, from the impedance based on the impedance code ODTC to the impedance based on the impedance code RONC, with the time t21. This is because the level of the data terminal 21 during the control period T1 before the time t20 and the level of the data terminal 21 during the control period T3 between the time t20 to the time t21 are equal to each other, and a change in the impedance of the pull-down buffer circuit 200 during the periods does not substantially affect other semiconductor devices connected to the semiconductor device 10.

Therefore, the timing to change the selection signals SEL1 to SEL7 may be at any moment as long as it is within the control period T3 from the time t20 to the time t21, which eliminates the need to strictly control the timing by using the output clock signal LCLK. As a result of this, as shown in FIG. 4, the selection signals SEL1 to SEL7 that specify the impedance of the pull-up buffer circuit 100 and the pull-down buffer circuit 200 can be inputted into the output control circuits 400P and 400N that are provided just before the buffer circuits 100 and 200, not into the serializer 300. In FIG. 15, the change in the selection signal SEL is schematically represented in binary. In FIG. 15, the low level of the selection signal SEL means that the impedance code ODTC is selected, and the high level of the selection signal SEL means that the impedance code RONC is selected.

Figure 16:
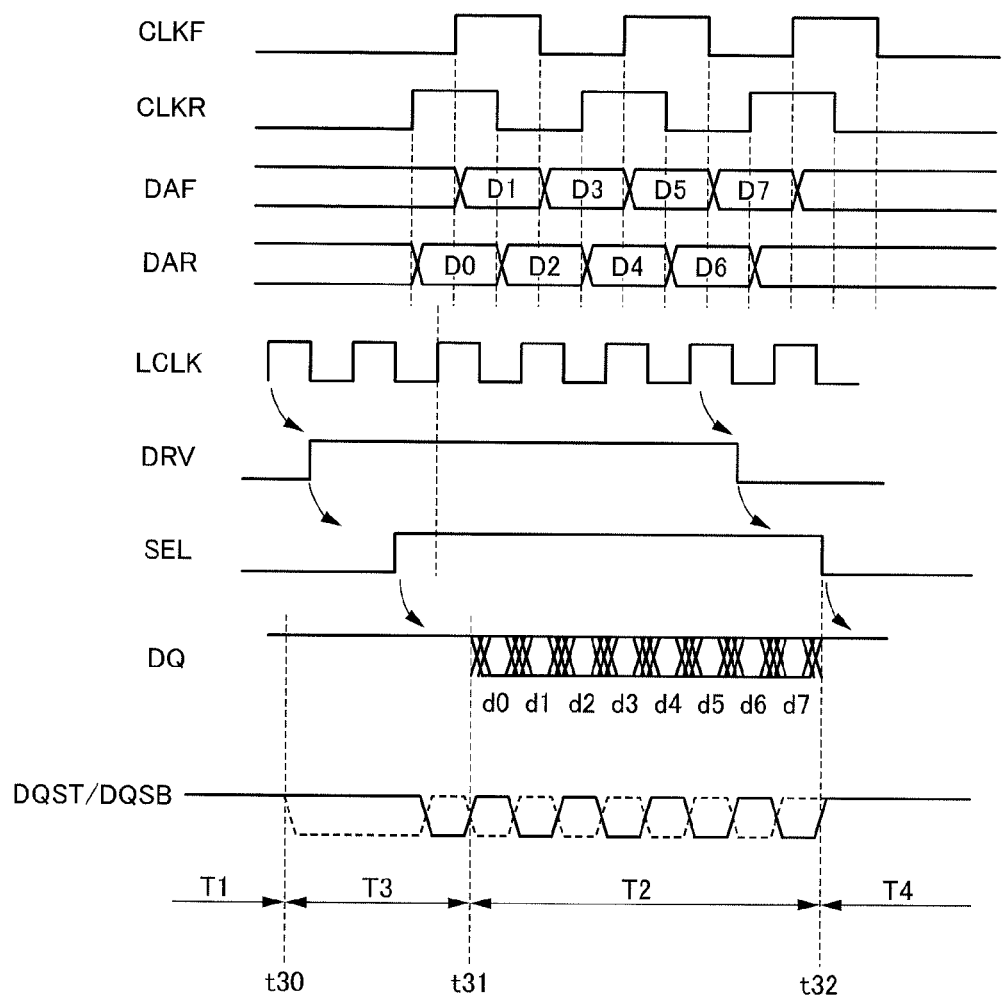
FIG. 16 is a timing chart for explaining the output operation of the read data according to another example.

FIG. 16 is a timing chart explaining the output operation of the read data DQ according to another example. According to the example shown in FIG. 16, the clocking of the strobe signals DQST/DQSB is started at a time t30, and the output of the read data DQ is started at a time t31 that is two clock cycles after the time t30. The output operation of the read data DQ is completed at a time t32. When the so-called preamble period is thus increased, a timing margin to switch the impedance of the pull-up buffer circuit 100 is also increased correspondingly.

Figure 17:
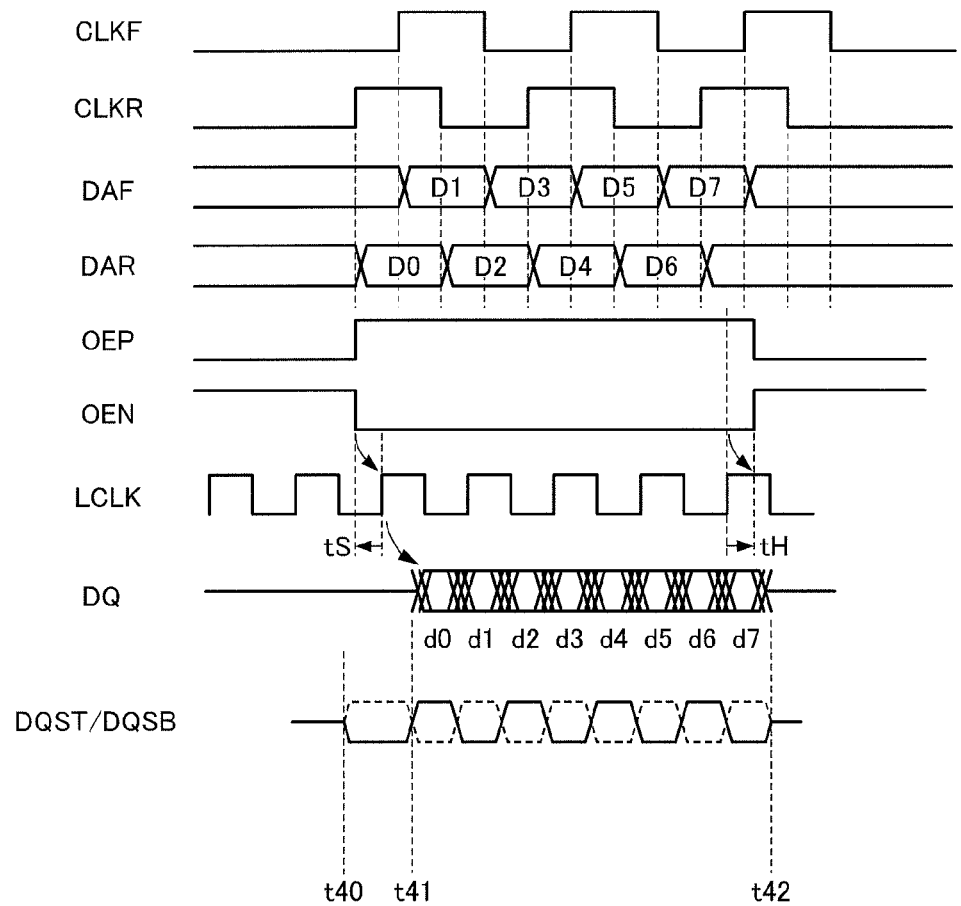
FIG. 17 is a timing chart that the inventors have conceived as a prototype in the course of making the present invention.

According to the prototype example shown in FIG. 17, the clocking of the strobe signals DQST/DQSB is started at a time t40, and the output of the read data DQ is started at a time t41 that is one clock cycle after the time t40. The output operation of the read data DQ is completed at a time t42. According to this prototype example, the termination level of the data terminal 21 is set to be VDD/2 as explained with reference to FIG. 3. In this case, the timing to switch the impedance of the output buffer circuit 70 needs to precisely coincide with the timing to start the output of the read data DQ. This means that it is necessary to input a signal for switching the impedance of the output buffer circuit 70 into the serializer. In FIG. 17, a signal to switch the impedance of the pull-up buffer circuit 100 is represented as OEP, and a signal to switch the impedance of the pull-down buffer circuit 200 is represented as OEN. Thus, according to this prototype example, the signals OEP and OEN need to be inputted into the serializer, which makes the timing margin severe irrespective of the length of the preamble period. In FIG. 17, a setup margin is represented as tS, and a hold margin is represented as tH.

On the contrary, the present embodiment has no such problems, and allows plenty of time to switch the impedance.

It is apparent that the present invention is not limited to the above embodiments, but may be modified and changed without departing from the scope and spirit of the invention.

What is claimed is:
1. A semiconductor device comprising:
a data terminal;
a first power supply line supplying a first potential;

a second power supply line supplying a second potential different from the first potential;

a first buffer circuit coupled between the first power supply line and the data terminal;

a second buffer circuit coupled between the second power supply line and the data terminal;

a first control circuit generating first and second internal data signals that are complementary to each other;

a level shifter generating third and fourth internal data signals that are complementary to each other by changing amplitude values of the first and second internal data signals; and an adjustment circuit to synthesize an inverted signal of the first internal data signal with the second internal data signal, and to synthesize an inverted signal of the second internal data signal with the first internal data signal, wherein the first and second buffer circuits are controlled based on the third and fourth internal data signals such that one of the first and second buffer circuits turns on and the other of the first and second buffer circuits turns off.

2. A semiconductor device comprising:

a data terminal;

a first power supply line supplying a first potential;

a second power supply line supplying a second potential different from the first potential;

a first buffer circuit coupled between the first power supply line and the data terminal;

a second buffer circuit coupled between the second power supply line and the data terminal;

a first control circuit generating first and second internal data signals that are complementary to each other;

a level shifter generating third and fourth internal data signals that are complementary to each other by changing amplitude values of the first and second internal data signals; and an adjustment circuit that brings the first internal data signal into a predetermined level, wherein the first and second buffer circuits are controlled based on the third and fourth internal data signals such that one of the first and second buffer circuits turns on and the other of the first and second buffer circuits turns off.

3. The semiconductor device as claimed in claim 2, wherein the adjustment circuit is activated by a reset signal.

4. A semiconductor device comprising:

a data terminal;

a first power supply line supplying a first potential;

a second power supply line supplying a second potential different from the first potential;

a first buffer circuit coupled between the first power supply line and the data terminal;

a second buffer circuit coupled between the second power supply line and the data terminal;

a first control circuit generating first and second internal data signals that are complementary to each other;

a level shifter generating third and fourth internal data signals that are complementary to each other by changing amplitude values of the first and second internal data signals; and a second control circuit that generates a selection signal, wherein the first and second buffer circuits are controlled based on the third and fourth internal data signals such that one of the first and second buffer circuits turns on and the other of the first and second buffer circuits turns off, and wherein:

an impedance of the first buffer circuit is controlled based on a logic level of the third internal data signal and a value of the selection signal, an impedance of the second buffer circuit is controlled based on a logic level of the fourth internal data signal and the value of the selection signal, and the first control circuit, when the first buffer circuit is to be used to a termination resistor, sets a logic level of the first internal data signal to turn the first buffer circuit on and the second control circuit generates the selection signal having a first predetermined value.

5. A semiconductor device comprising:

a data terminal;

a first power supply line supplying a first potential;

a second power supply line supplying a second potential different from the first potential;

a first buffer circuit coupled between the first power supply line and the data terminal;

a second buffer circuit coupled between the second power supply line and the data terminal;

a first control circuit generating first and second internal data signals that are complementary to each other;

a level shifter generating third and fourth internal data signals that are complementary to each other by changing amplitude values of the first and second internal data signals; and a second control circuit that generates a selection signal, wherein the first and second buffer circuits are controlled based on the third and fourth internal data signals such that one of the first and second buffer circuits turns on and the other of the first and second buffer circuits turns off, and wherein:

an impedance of the first buffer circuit is controlled based on a logic level of the third internal data signal and a value of the selection signal, an impedance of the second buffer circuit is controlled based on a logic level of the fourth internal data signal and the value of the selection signal, and the first control circuit, when the first buffer circuit is set to be in a high impedance state, sets a logic level of the first internal data signal to turn the first buffer circuit on and the second control circuit generates the selection signal having a second predetermined value different from the first predetermined value.

6. A semiconductor device comprising:

a data terminal;

a first power supply line supplying a first potential;

a second power supply line supplying a second potential different from the first potential;

a first buffer circuit coupled between the first power supply line and the data terminal;

a second buffer circuit coupled between the second power supply line and the data terminal;

a first control circuit generating first and second internal data signals that are complementary to each other;

a level shifter generating third and fourth internal data signals that are complementary to each other by changing amplitude values of the first and second internal data signals; and a second control circuit that generates a selection signal, wherein the first and second buffer circuits are controlled based on the third and fourth internal data signals such that one of the first and second buffer circuits turns on and the other of the first and second buffer circuits turns off, and wherein:
each of the first and second buffer circuits includes a plurality of unit buffer circuits connected in parallel, and
the selection signal indicates a number of the unit buffer circuits to be turned on.

7. The semiconductor device as claimed in claim 6, further comprising a fourth control circuit synthesizing the third and fourth internal data signals and the selection signal,
wherein the first and second buffer circuits are controlled based on an output signal of the fourth control circuit.

8. A semiconductor device comprising:
a data terminal;
a first power supply line supplying a first potential;
a second power supply line supplying a second potential different from the first potential;
a plurality of first unit buffer circuits coupled in parallel between the first power supply line and the data terminal;
a plurality of second unit buffer circuits coupled in parallel between the second power supply line and the data terminal;
a level shifter changing an amplitude of one-bit signal from a first amplitude to a second amplitude between first and second potentials;
a first circuit controlling the first unit buffer circuits such that all the first unit buffer circuits are turned off when the one-bit signal from the level shifter has a first value, and that selected zero or more of the first unit buffer circuits are turned on based on a value of a selection signal when the one-bit signal from the level shifter has a second value; and
a second circuit controlling the second unit buffer circuits such that all the second unit buffer circuits are turned off when the one-bit signal from the level shifter has a second value, and that selected zero or more of the second unit buffer circuits are turned on based on a value of the selection signal when the one-bit signal from the level shifter has a first value.

9. The semiconductor device as claimed in claim 8, wherein the one-bit signal is controlled based on a read data to be output from the data terminal.

10. The semiconductor device as claimed in claim 9, wherein the value of the selection signal is changed when a read operation in which the read data is output is started or ended.

11. The semiconductor device as claimed in claim 8, wherein the one-bit signal is fixed to the second value during an ODT operation.

12. The semiconductor device as claimed in claim 11, wherein the value of the selection signal is changed when the ODT operation is started or ended.

13. The semiconductor device as claimed in claim 8, wherein the one-bit signal is fixed to the second value when the data terminal is to be a high impedance state.

14. The semiconductor device as claimed in claim 13, wherein all the first unit buffer circuits are turned off based on the value of the selection signal when the data terminal is to be a high impedance state.

15. The semiconductor device as claimed in claim 8, wherein the first unit buffer circuits have substantially the same impedance one another in an on state, and the second unit buffer circuits have substantially the same impedance one another in an on state.

16. The semiconductor device as claimed in claim 15, wherein
each of the first unit buffer circuits includes a plurality of first transistors of a first conductivity type connected in parallel, at least two of the first transistors having different channel width from each other, and
each of the second unit buffer circuits includes a plurality of second transistors of a second conductivity type connected in parallel, at least two of the second transistors having different channel width from each other.

17. A semiconductor device comprising:
a first power supply line supplied with a first potential;
a second power supply line supplied with a second potential lower than the first potential;
a third power supply line supplied with a third potential lower than the first potential er than the second potential;
a first control circuit configured to receive in parallel a plurality of internal data signal pairs, each internal data signal pair including of a first internal data signal and a second internal data signal provided complementary to the first internal data signal and to output in series the plurality of internal data signal pairs of the first internal data signal and the second internal data signal, the first and second internal data signals being the same in amplitude as each other;
a level shifter configured to receive in series the internal data signal pairs of the first internal data signal and the second internal data signal and to output in series a plurality of pairs of a third internal data signal corresponding to the first internal data signal and a fourth internal data signal corresponding to the second internal data signal, the pairs of the third and fourth internal data signals being the same in amplitude as each other and being greater in amplitude than the first and second internal data signals,
a data output buffer coupled to the first and second power supply lines, the data output buffer being configured to be controlled in response to the first and second internal data signals; and
wherein the first control circuit is coupled to the third and second power supply lines.

18. The semiconductor device as claimed in claim 17, further comprising:
an external data terminal coupled to the data output buffer.

19. The semiconductor device as claimed in claim 17, further comprising:
a memory cell array including a plurality of memory cells, each of the internal data signal pairs of the first internal data signal and the second internal data signal being derived from a corresponding one of the memory cells.

* * * * *